United States Patent [19]
Poussart et al.

[11] 4,067,060
[45] Jan. 3, 1978

[54] TRANSFER FUNCTION MEASUREMENT

[75] Inventors: Denis Poussart; Udaya Ganguly, both of Ste-Foy, Canada

[73] Assignee: Canadian Patents and Development Limited, Ottawa, Canada

[21] Appl. No.: 702,764

[22] Filed: July 6, 1976

[51] Int. Cl.² ............................................. G06F 15/34
[52] U.S. Cl. .................. 364/553; 324/77 B; 364/576
[58] Field of Search ............ 235/151.3, 152, 156; 324/77 A, 77 B

[56] References Cited

U.S. PATENT DOCUMENTS

| | | | |
|---|---|---|---|
| 3,240,919 | 3/1966 | Schultz | 235/151.3 |
| 3,586,846 | 6/1971 | Ley | 235/181 |
| 3,718,813 | 2/1973 | Williams, Jr. et al. | 235/151.3 X |
| 3,973,112 | 8/1976 | Sloane | 235/156 |
| 3,988,667 | 10/1976 | Roth et al. | 324/77 B X |

*Primary Examiner*—Jerry Smith
*Attorney, Agent, or Firm*—James R. Hughes

[57] ABSTRACT

An apparatus for the measurement in realtime of the transfer function in both magnitude and phase of an unknown system including apparatus for generating a pseudo-random binary sequence as a test signal, means to match the timing of this sequence and of the sampling process so that the discrete Fourier transform (DFT) of the test signal and the response signal obtained from the unknown system can be computed, means such that this operation can be repeated successively in precisely the same manner without significant time (phase) jitter, means such that the magnitude function obtained from any single transformation can be computed and displayed, and means such that the difference between the phase functions obtained from two distinct DFT's can be computed and displayed.

4 Claims, 13 Drawing Figures

TRANSFER FUNCTION MEASUREMENT

This invention relates to a method and apparatus for the measurement in real-time of transfer function in both magnitude and phase.

The measurement of input-output transfer functions is a basic approach to the characterization of systems (physical, electrical, mechanical, biological, etc). While the usual techniques are rather time-consuming, there exist numerous instances where, in addition to convenience, the measurement should be performed in the minimum time. This is the case, for instance when the system under study is not strictly time-invariant.

In considering a linear, time-invariant, single input-single output system, it is well-known that its input-output characteristics are completely described, in the time domain, by the impulse response $h(t)$. It is also described by the transfer function $H(f)$ in the frequency domain. This complex function can be expressed in the form of a magnitude $Mag_H$ and phase $Arg_H$. The function $h(t)$ and $H(f)$ convey equivalent information since they are simply related through Fourier transforms:

$$H(f) = Fh(t)$$

$$h(t) = F^{-1}H(f)$$

Methods of transfer function measurement in general use fall in one of the following categories.

i. Sine-wave response

A sine wave of frequency $f_o$ is applied as an input test signal to the system under study. Once the response is in steady-state, its magnitude and phase relative to the input is measured using conventional techniques (such as Lissajous patterns or synchronous detection for phase and voltmeter for magnitude).

This method is simple and inexpensive. However data is obtained at a single frequency at any given time, and the measurement must be repeated, sequentially. In the common case where the frequency limits of interest are $$f_{min} = \Delta f$$

$$f_{max} = K\Delta f$$

a lower bound in the total time required for the measurement is $K/\Delta f$ sec since the time required to achieve "steady-state" at each data point, a priori, is of the order of $1/\Delta f$.

ii. Impulse response

A single impulse stimulus yields the impulse response $h(t)$. The quantities $Mag_H$ and $Arg_H$ are then directly available following Fourier transforms of $h(t)$. In principle, this method provides maximum speed since $h(t)$, which is transient, has a duration of significance of the order of $1/\Delta f$ sec. If the time required to complete the Fourier transform of $h(t)$ is shorter than $1/\Delta f$ sec, this method operates in real-time. However, there exists at least two disadvantages inherent to this technique which limit its practicality. First, the perturbation is applied to the unknown system in a single blow, i.e. with a very high peak to average power ratio. This may drive the system into non-linear regime where $h(t)$ loses its simple meaning. Second, errors in the computation of the Fourier transform are more likely to occur because of the large dynamic range of the response.

iii. White noise response

If white noise is applied to the system under study, the cross-correlation function $R(t)$ yields a direct estimate of the impulse response $h(t)$. $H(f)$ can then be obtained, as previously, following Fourier transformation of R. The problems of limited dynamic range due to finite length of computation registers also arise with this approach, although there exist other ways of computing the cross-spectrum $H(f)$ without going through the intermediate cross-correlation functions. With white noise as an input, the system is perturbed at "all" frequencies simultaneously. However, any particular sample of white noise over a finite data window is not perfectly white. It is rather necessary to average a large number of individual measurements which, asymptotically, converge to the desired quantity. This results in an overall duration of measurement which can be prohibitively long.

In summary, for fast (real-time) operation, measurements must be performed at "all" frequencies simultaneously. The only test signal which is white (i.e. constant) both in magnitude and in phase is the impulse. It is fast but typically presents serious problems of dynamic range. Sine-wave response is time-consuming because it requires a sequential set of individual measurements. White-noise response is time-consuming because statistical fluctuations must be smoothed out by averaging.

From the considerations of the previous sections, it is apparent that the most appropriate test signal for practical transfer function analysis would include the following properties:

a. wideband: "all" frequencies of interest are simultaneously present with sufficient energy for adequate signal/noise ratio.
b. low peak-to-average power ratio: with a test signal of limited dynamic range, system non-linearities and errors due to computation round-off are less likely.
c. deterministic: without statistical fluctuations, averaging is not required.
d. precisely known magnitude and phase characteristics when expanded over a given time span of duration T.

There exist different test signals with these properties.

It is an object of the present invention to provide a method and apparatus of transfer function analysis which in a minimum of time (in real time) yields simultaneous and absolutely calibrated measurements of both magnitude and phase over a frequency band consisting of a number of discrete points.

It is another object of the invention to provide a transfer function analyser that has unique features of speed, accuracy, and flexibility of operation, i.e. a practical instrument which will measure $Mag_H$ and $Arg_H$, with emphasis on speed (i.e. using a minimum length of test data), over a specified range of frequencies $f_{min}$ to $f_{max}$, and with a specified resolution $\Delta f$.

These and other objects of the invention are achieved by an apparatus for the measurement in real-time of the transfer function in both magnitude and phase of an unknown system comprising: means for engendering a pseudo-random binary sequence test signal, said signal spectrum being white in amplitude; a sampling and memory circuit; means to apply the PRBS signal either directly to the sampling and memory means as a reference signal or to the unknown system such as to obtain a response signal that is applied to the sampling and memory means; means to match the timing of the input test signal and the sampling and memory circuit; means connected to the output of the sampling and memory circuit for measuring the discrete fourier transform in terms of magnitude and phase of the signal applied from the sampling and memory circuit; means for computing the magnitude portion of the transfer function from the signal obtained from the means for measuring discrete fourier transform storing said information and passing to an output; means for computing the phase portion of the transfer function from the signal obtained from the means for measuring discrete fourier transform; a first memory means connected to the output of the means for computing the phase portion of the transfer function for storing the phase portion of the transfer function in relation to the reference signal; a second memory means connected to the output of the means for computing the phase portion of the transfer function for storing the phase portion of the transfer function in relation to the response signal; and means for subtracting the signals obtained from the first and second memory means and passing the result to an output.

In drawings in which embodiments of the invention are illustrated,

Figure 7:
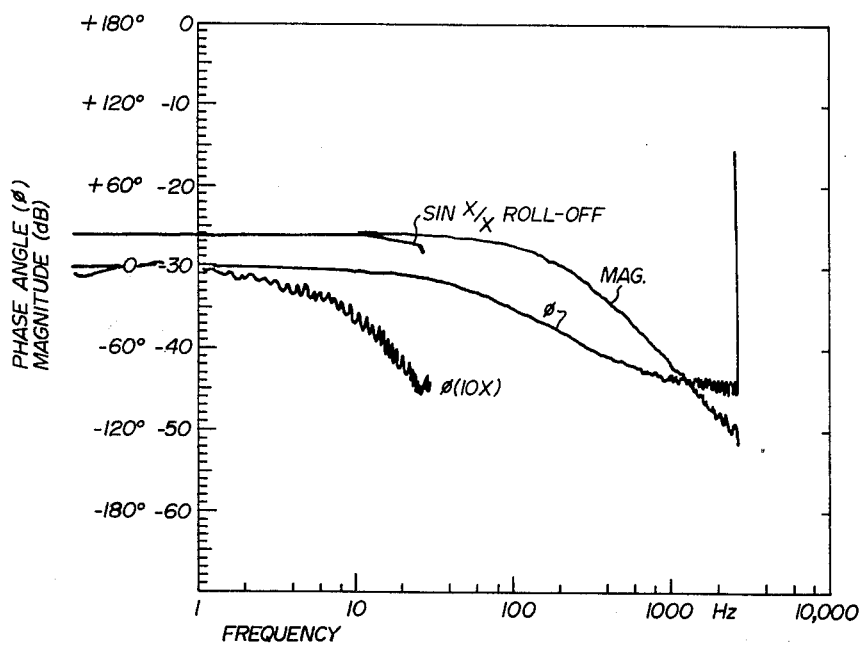
Figure 8:
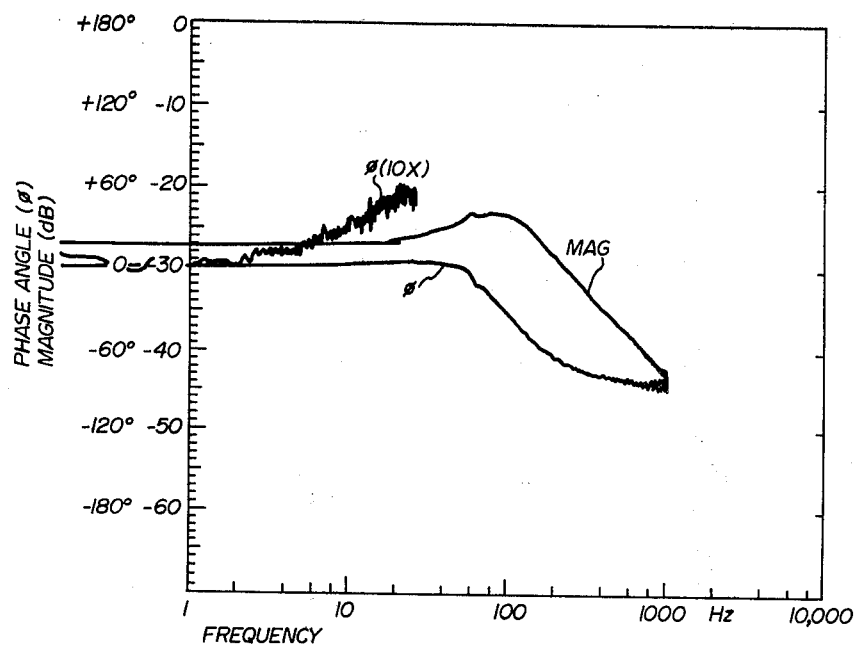
Figure 9:
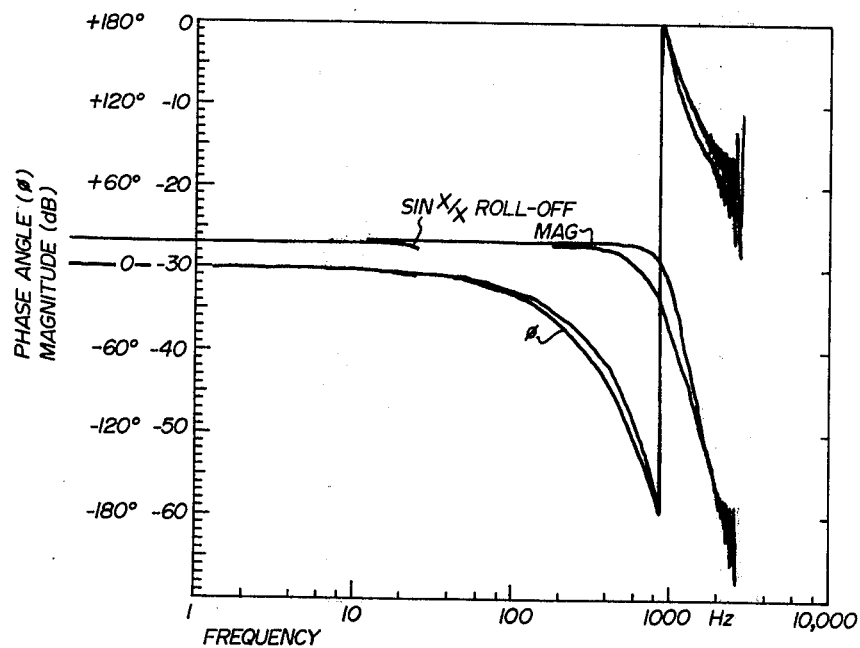
Figure 11:
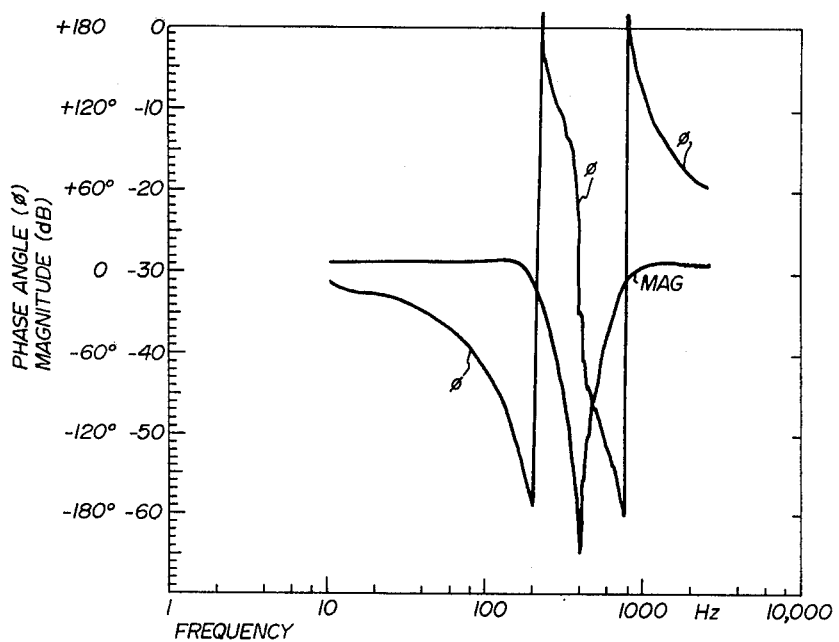
Figure 10:
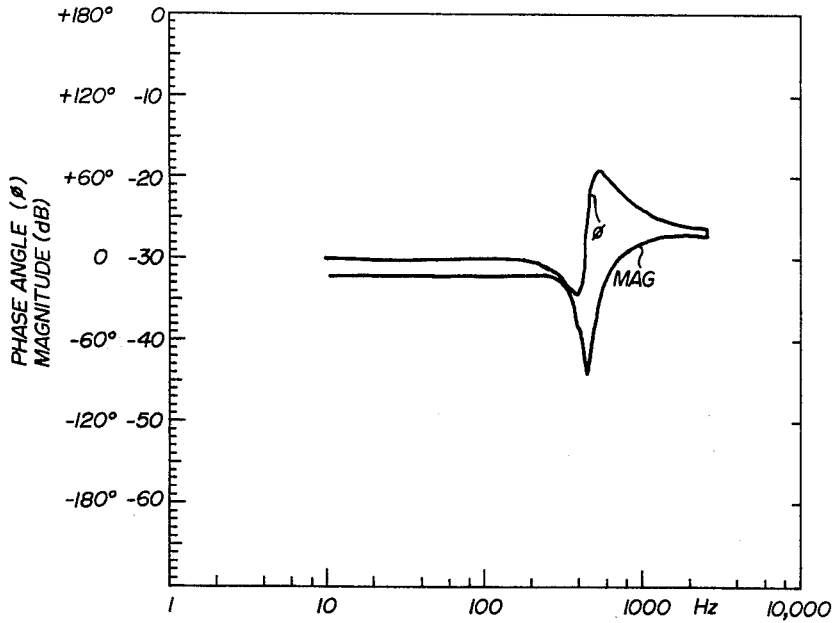
Figure 12:
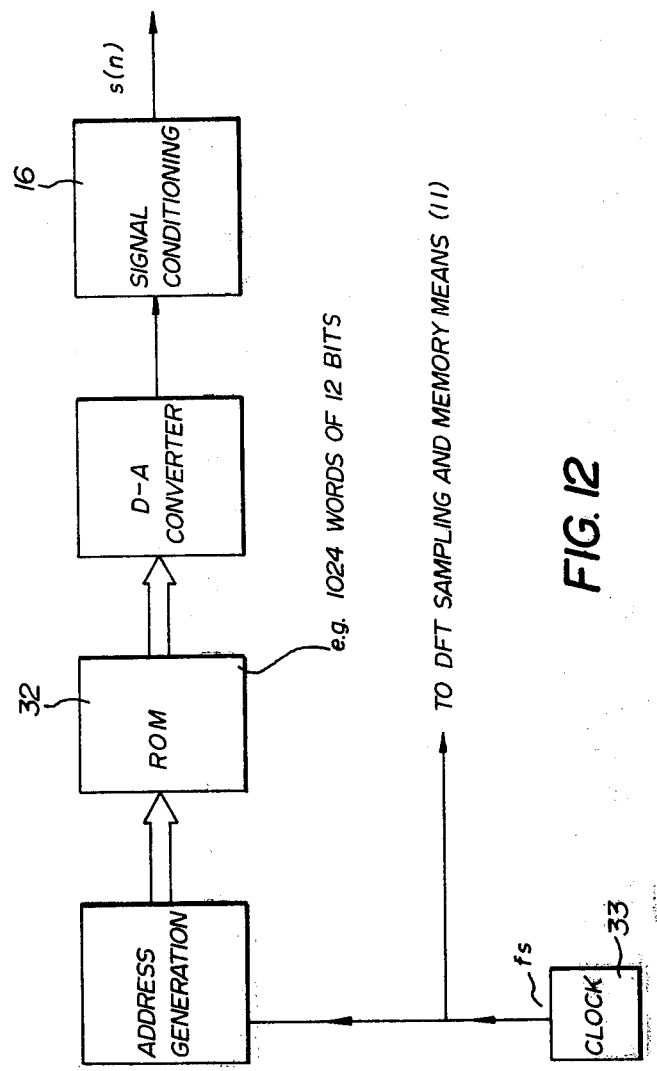

FIG. 7 shows magnitude and phase of first order systems over two overlapping bands, FIG. 8 shows magnitude and phase of second-order systems over three overlapping bands, FIG. 9 shows magnitude and phase of fourth-order Bessel and Butterworth low-pass filters, FIGS. 10 and 11 are experimental plots of curves showing the transfer and functions of notch filters, and FIG. 12 is a block diagram of the device with a ROM providing the test signal.

Figure 1:
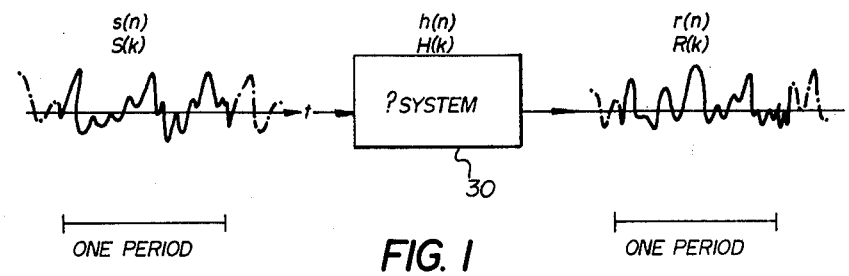
FIG. 1 illustrates the objective of the invention which is to measure the transfer function of unknown system H, from the response R to an applied stimulus S. The argument $n$ is the index along the discrete time axis, $k$ is a corresponding index along the discrete frequency axis.

Since we shall be dealing with discrete time and frequency series, we define such a (sampled) signal $s(n)$ where $n$ is the index of discrete times spaced $\Delta t$ apart (see FIG. 1) to give a response signal $r(n)$ after passing through an unknown system 30 having a transfer function H from response R to stimulus S.

From properties [c and d,] given above, $s(n)$ can be considered periodic with period N (total number of sample points in one time period, $T = N\Delta t$), and expressed as a Fourier series.

$$s(n) = \Sigma_k A_S(k) \cos 2\pi k n + B_S(k) \sin 2\pi k n$$

In this expression, $k$ is the index of discrete components with frequencies 1/T, 2T, . . . , K/T. From the sampling theorem, the maximum number of such components is limited to N/2 if the signal is perfectly band-limited. With realistic anti-aliasing filters, the actual number of such components will be less than N/2.

This signal $s(n)$ can then be expressed in the frequency domain as its complex transform, with real and imaginary components $$S(k) = A_S(k), B_S(k)$$

or equivalent, as magnitude and phase components $$S(k) = \text{Mag}_S(k), \text{Arg}_S(k)$$

where $$\text{Mag}_S(k) = \sqrt{A_S^2(k) + B_S^2(k)}$$

and $$\text{Arg}_S(k) = tg^{-1}(B_S(k)/A_S(k))$$

Similarly, the transfer function of the system (transform of discrete impulse response) can be written as $$H(k) = \text{Mag}_H(k), \text{Arg}_H(k)$$

and its steady-state (periodic) response $$R(k) = \text{Mag}_R(k), \text{Arg}_R(k)$$

From basic linear system theory, the unknown function H(k) can be obtained directly as $$\text{Mag}_H(k) = \text{Mag}_R(k)/\text{Mag}_S(k)$$

and $$\text{Arg}_H(k) = \text{Arg}_R(k) - \text{Arg}_S(k)$$

with the implicit and important assumption that both the test stimulus $s(n)$ and the response $r(n)$ are defined on precisely the same discrete time axis $n$.

Figure 2A:
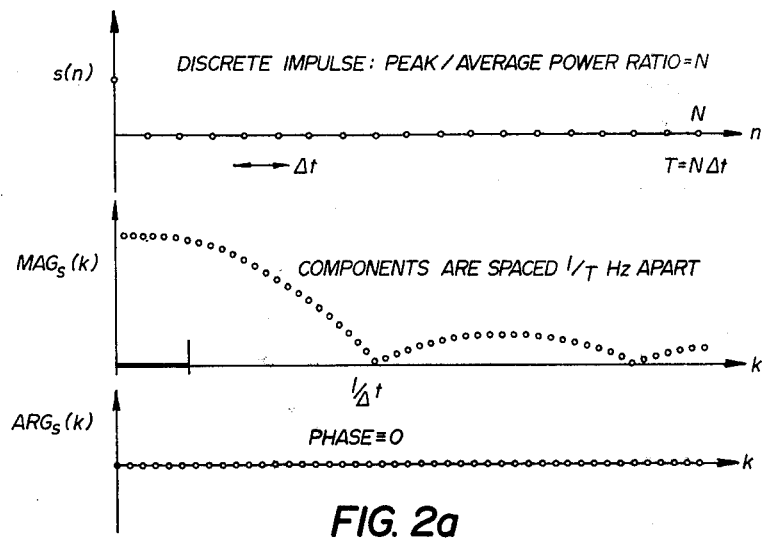
FIGS. 2a and 2b illustrate the basic characteristics of the discrete impulse and PRBS in the time and frequency domains.

It would be convenient, with respect to condition $d$, that the magnitude and the phase of the test signal be white, i.e. $\text{Mag}_S(k) = $ constant, $\text{Arg}_S(k) = 0$. A single computation of the response would yield the desired result without baseline correction. As noted previously, the only signal with this property is the impulse as shown in FIG. 2a which is rejected since it does not fit property [b.]

In the present instrument, a signal which is white either in magnitude ($\text{Mag}_S(k) = $ constant) or in phase ($\text{Arg}_S(k) = 0$) is employed. Baseline correction is required only for phase ($\text{Arg}_S(k) \neq 0$) or magnitude ($\text{Mag}_S(k) \neq$ constant).

Wideband signals with white phase can be synthesised by forcing simple symmetry around the mid period, such as $$s(n) = s(N - n) \rightarrow \text{Arg}_S(k) = 0$$

Figure 2B:
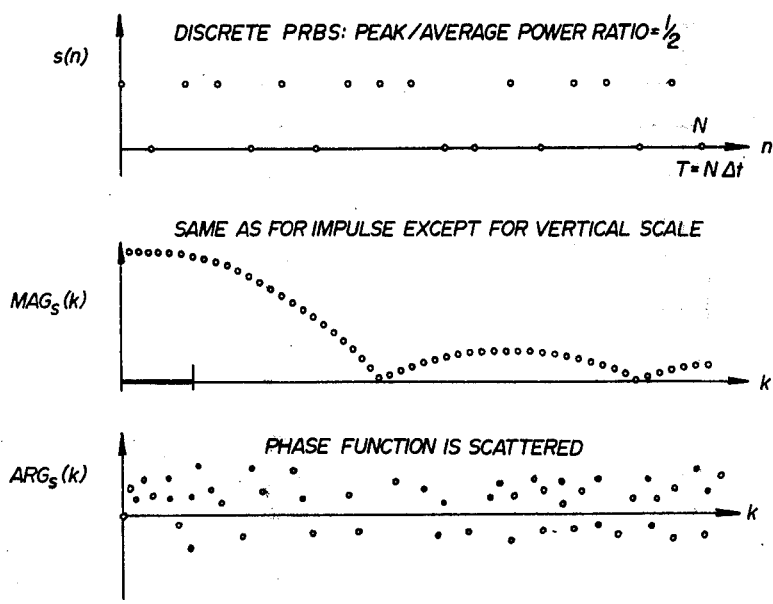

In the apparatus to be described in more detail below, $s(n)$ consists of a pseudo-random binary sequence (PRBS). By virtue of its detailed time structure (see FIG. 2b), the magnitude function of this signal is white just as that of an impulse. Properties a–d are satisfied, including a favorable peak to average power ratio. However, regarding the present application, PRBS signal have pecularities:

i. Due to fundamental considerations, a PRBS cannot be defined over any arbitrary value of N. This creates a problem for efficient computation of Discrete Fourier Transform (DTF).

ii. Its phase function $Arg_S(k)$ takes extremely scattered values for the various components $k$. In order to maintain overall accuracy, precise baseline compensation must be implemented.

Figure 3:
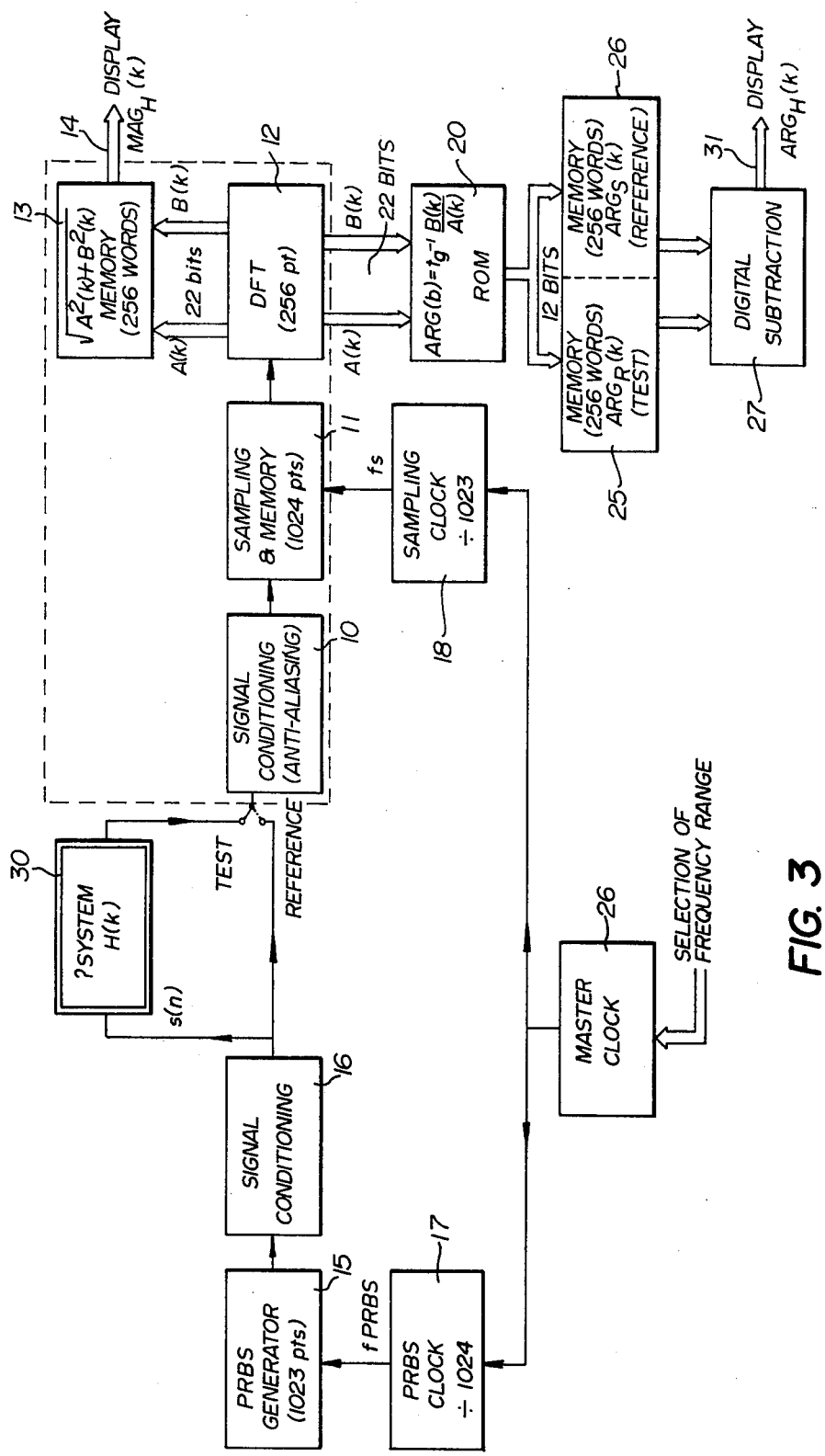
FIG. 3 is a block diagram of one version of the system.

FIG. 3 shows the basic block diagram of the instrument. Capabilities for fast discrete function transfer measurement are required. In the present version, this function is performed by a commercially available unit (shown within the dashed line) and consists of a signal conditioning (anti-aliasing filter) circuit 10, a sampling and memory circuit 11, a discrete fourier transform analyser 12, and a memory 13 with output display 14.

In essence, the measurement of $Mag_H(k)$ and $Arg_H(k)$ proceeds as follows:

a. $Arg_S(k)$ is computed and stored in a memory 26 (reference phase)

b. The test signal is applied to the unknown system 30. $Arg_R(k)$ is computed from the response and stored in a second memory 25 (test memory). $Mag_R(k)$ is also computed and stored in a third memory 13.

c. The quantity $Arg_R(k) - Arg_S(k)$ is computed in 27 and displayed synchronously with $Mag_R(k)$ in 31, thus providing simultaneous and absolutely calibrated values of $Arg_H(k)$ and $Mag_H(k)$.

Operation (a) needs to be done only once since the test signal is always the same (unless purposely modified). Data is available within 100 milliseconds after the end of the test signals.

A 1023 bit - long PRBS signal is generated by the standard technique of a 10 stage digital shift register 15 with appropriate feedback and connected to master clock 16 via divider 17. This binary signal is transformed into an anolog version with symmetrical and adjustable amplitude in signal conditioning circuit 16 which in essence is a low pass filter. Out of the possible 1023 states of the register there exists two conditions which are especially indentified (first is switch-selectable, second is hard-wired). At any time, the sequence can be reset to first one. Synchronisation signals REP and SYNC2 are generated each time the sequence goes through these states. (See FIG. 4).

REP identifies the (selected) beginning of the sequence. SYNC 2 forecasts the end of the sequence and reinitializes the control of both memories where phase computations are stored (see below).

Figure 4:
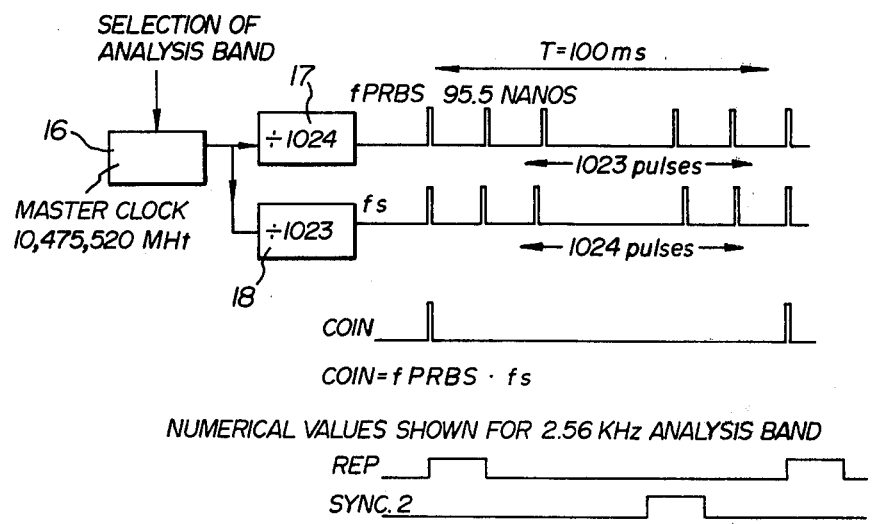
FIG. 4 shows a basic circuit for achieving frequency and phase synchronization between PRBS and DFT sampling.
Figure 6:
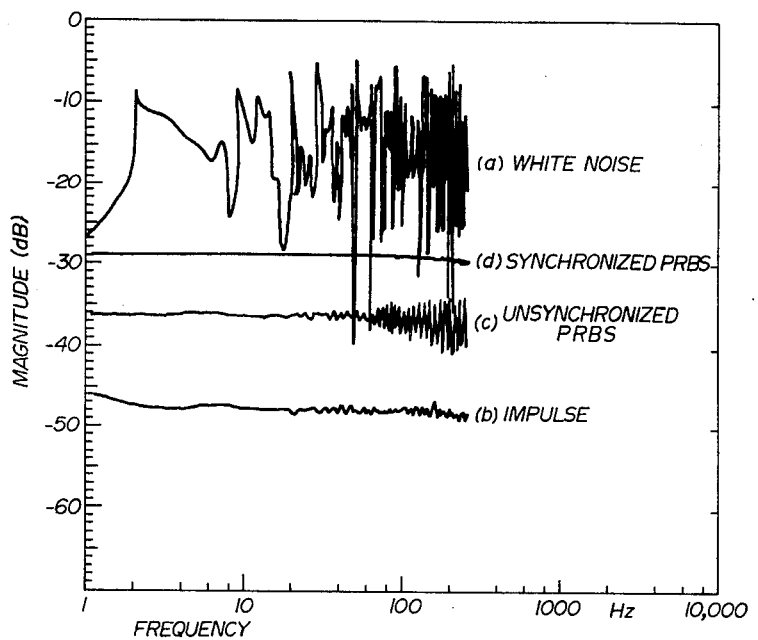
FIG. 6 is a graph illustrating relative merits of various possible test signals.

PRBS signals can only be generated over certain numbers of discrete points such as $2^p - 1$, where $p$ is an integer. However, digital DFT computations are most efficient when performed on data arrays on length $2^p$. In the present instrument, time expansion/compression is used to precisely match the duration of the PRBS ($p=10$, 1023 clock periods covering T seconds) with the duration of the data array for the DFT (1024 clock periods also covering T seconds). This linear interpolation of the signal is such that one complete PRBS sequence occurs for each DFT, without truncation or spill-over. This is most important since the magnitude on the PRBS is white only if computed over one exact period. As shown in FIG. 6, a truncation of a signle bit (i.e. 0.1% error in relative timing) generates significant aberrations. FIG. 4 shows how the precise matching is obtained. The PRBS clock 17 (fPRBS) and the sampling clock 18 (fS) are both derived from a single master clock 16, through two separate chains, ÷ 1024 and ÷ 1023 respectively. The frequency of the master clock determines the analysis band. In addition to frequency, relative phase between $f$ PRBS and $fS$ must be accurately maintained. The unknown phase of the system is to be computed from the difference between two measurements ("reference" and "test"). A possible phase jitter as small as ± 1 clock pulse could generate an unacceptable error (up to 90° with the present size of the data array). FIG. 4 shows how phase jitter is prevented. Once every 1023 PRBS clock pulses there is perfect coincidence with one of the 1024 sampling clock pulses. This unique event is used to generate a tag, called COIN, which constitutes the master synchronisation of the instrument. When COIN occurs, i. it resets the PRBS to its switch-selected initial state ii. it initiates sampling for the DFT This scheme maintains perfect register between the signals and the DFT, down to the fine structure of the sequence. If some time shift occurs for some reason (such as switching to a difference analysis band), synchronisation is automatically restored at the beginning of the next period. Moreover, in this way, the image of PRBS in the date array becomes independent of the actual time. The reference phase becomes the same for all analysis bands and needs to be computed only once unless the initial state of PRBS is purposely modified.

The DFT needed in the present instrument can be computed on a special purpose Fourier transformer or on a general digital computer (e.g. with FFT algorithm). In the present description, this function is performed by a commercially available Real-time spectrum analyser. 256 Fourier components are computed from a 1024 points data array in less than 100 milliseconds. Digital I/O lines provide interfacing and control for all important signals and functions, including slaving to an external sampling clock, 11-bit real and imaginary parts, and magnitude.

Magnitude computation function is performed by the spectrum analyser. Since the magnitude of the PRBS is white, and known absolutely, $Mag_H(k)$ is derived directly from DFT 12 and memory 13 within a known constant, from $Mag_R(k)$. Thus there is no need for a reference memory for magnitude.

Figure 5:
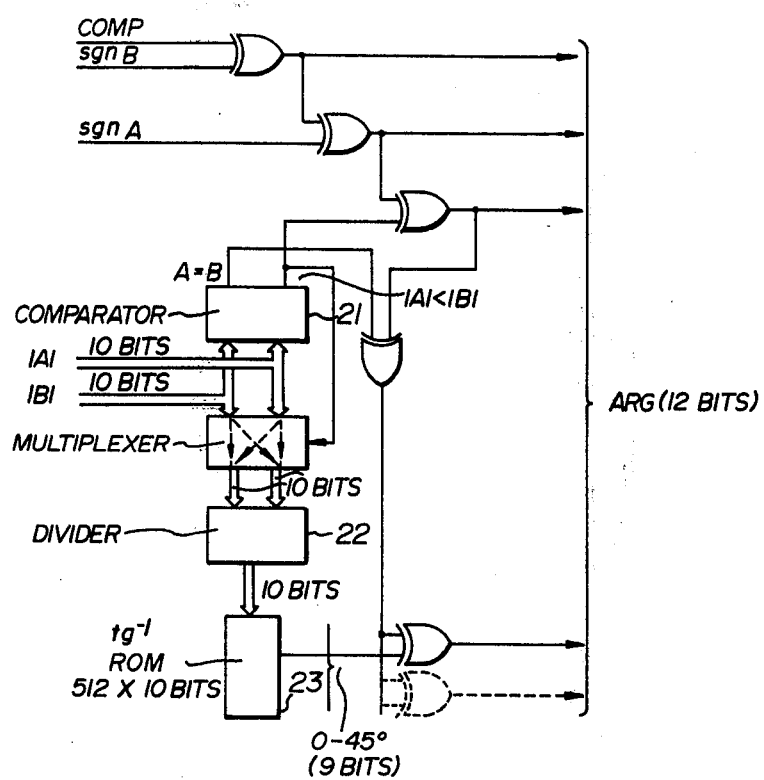
FIG. 5 shows a circuit for computing and encoding $\text{Arg}(k) = g^{-1} B/A$.

Phase computation is obtained in the following manner. Once the 1024 data array has been filled (with exactly one period of the PRBS or of the system response) the DFT takes place. Pairs of Fourier components, $A(k)$ and $B(k)$ are computed sequentially (from $k = 1$ to $k = K = 256$) and made available to the phase computing circuit 20. FIG. 5 shows the basic block diagram of this function. For each $k$, the following operations take place in sequence, (dropping the argument $k$ for compactness):

a. A and B are stored temporarily in two registers in the form sgn A, mag A, sgnB, magB (sign-magnitude binary encoding, 10 bits plus sign).

b. mag A and mag are applied to a comparator 21 which determines the conditions mag B > mag A (or its complement) or mag B = mag A.

c. Following this comparison, the smaller number is fed as the numerator and the larger number is fed as the denominator to a digital divider 22.

d. The division is computed as a 9-bit word with magnitude ranging between 0 and 1.

e. This 9-bit word is applied to a read-only memory (ROM) 23 where the values of $\theta = tg^{-1}x$ (9-bits) for 512 discrete values of $\theta$ ranging between 0° and 45° are stored.

f. This 9-bit angle (within an octant) is combined with 3 additional bits derived from sgn A, sgn B, mag B > mag A to form a 12-bit angle ranging between 0° and 360°. The special case where mag B = mag A (e.g. Arg = 45°, 135°, etc) is also taken care of. Finally the COMP bit shown on the figure can be set to generate, if needed, the complement of the angle. This required, eventually, for substracting the base line.

In the present device, a pair of Fourier components is available every 350μsec. The phase computation is completed within 15μsec for each $k$ and takes place during the computation of the next A and B. The total computation time for 256 points, then, is aproximately 90 milliseconds.

Two memory banks of 256 words of 12 bits are included for storing the reference and the test phase functions. When the SYNC2 pulse (described above) occurs, the selected memory is write-enabled and the internal write-address register is cleared. Following completion of the test or response signal, Arg($k$) is computed and stored, sequentially, in the selected memory (25 or 26 of FIG. 3). The write-address register is incremented for each $k$. If the reference memory is selected, $-\text{Arg}_S(k)$ is computed and stored. When the 256 values have been stored, both memories switch to the read-mode, with the read-address now being derived from that of the Mag($k$) memory (Mag($k$) having been computed and stored in the DFT unit in the meantime).

As the digital phases — $\text{Arg}_S(k)$ and $\text{Arg}_R(k)$ are read-out repetitively, the corresponding pairs of 12-bits words are applied to a full adder 27. Through appropriate gating, the quantities — $\text{Arg}_S(k)$, $\text{Arg}_R(k)$, or $\text{Arg}_H(k) = \text{Arg}_R(k) - \text{Arg}_S(k)$ can be selected and fed to a D-A converter (not shown). Following proper scaling and buffering, the resulting analog signal is available for CRT display and XY plotting. In addition, a numeric display of phase (± 0.1°) is available for any selected frequency derived from the CRT cursor on the cursor on the DFT analyser (used for numeric frequency (in HZ) magnitude (± 0.1 dB) read-outs).

Initially, the operator selects one of the following analysis bands (256 pts) which have been implemented.

| RANGE (HZ)  | Resolution (HZ) | Data window (sec) |
|-------------|-----------------|-------------------|
| 0.1 to 25.6 | 0.1             | 10                |
| 0.2 to 51.2 | 0.2             | 5                 |
| 0.4 to 102.4| 0.4             | 2.5               |
| 1    to 256 | 1               | 1                 |
| 2    to 5.2 | 2               | 0.5               |
| 4    to 1024| 4               | 0.25              |
| 10   to 2560| 10              | 0.1               |

This, in turn, automatically selects the required frequency of the master clock together with the cut-off frequency of the anti-aliasing filters (6th order Butterworth, located within the DFT unit).

The reference memory is then selected. This automatically connects the input of the DFT to the conditioned PRBS. Within 100 milliseconds after the end of the next full sequence, a reference phase — $\text{Arg}_S(k)$ has been computed and stored in memory 26 of FIG. 3. Normally this operation will not need to be repeated.

Next, the test memory is selected. This also connects the input of the DFT unit to the system 30 under measurement. Again at the end of the next full PRBS, the test phase $\text{Arg}_R(k)$ is computed and stored in memory 25. The two values ($\text{Arg}_S(k)$ and $\text{Arg}_R(k)$) are substracted in digital subtractor (adder) 27. Immediately thereafter, if the quantity $\text{Arg}_H(k)$ has been selected as a read-out, the system phase function is continuously displayed on the CRT 31 (together with numeric display of phase at cursor frequency) synchronously with the system magnitude function (on the CRT of the DFT unit).

The control provides for two operating modes. In the continuous mode, Mag and Arg displays are automatically updated for evey new response to the periodic PRBS, for instance every second in the 1-256HZ band. In this way it is possible to follow the dynamics of a system which is (slowly) evolving. In the TRANSient mode, a single shot measurement is captured and frozen until a manual or external trigger requests another measurement. This mode is convenient for viewing data in detail and for obtaining hard copy with an XY plotter.

Complete facilities for analog and digital self-calibration are included for checking the instrument and for selecting display factors on CRT or plotter. Digital calibration is performed by a built-in circuit which simulates the DFT unit by substituting A and B data with convenient phase (such as −180°, −60°, −30°, 0°, 60° and 180°). These numbers are then processed as if they were actual data.

The instrument is mostly implemented with TTL and MOS circuits. If is self complete and, together with its companion DFT unit, constitutes a compact system which is well adapted to field use.

For reference, FIG. 6 is a set of magnitude functions of different test signals: (a) sample of white noise, (b) impulse, (c) PRBS without 1023-1024 synchronisation, and (d) PRBS synchronised as discussed here. All signals are processed with full utilization of the dynamic range of the DFT unit but have been replotted at different vertical levels for clarity. The large statistical fluctuations of the white noise, which would require extensive averaging, are clearly visible. The significant computation noise which affects the impulse response due to poor utilization of available dynamic range is evident. The need for precise PRBS synchronisation can also be appreciated. In this example, a 1023 bit long sequence plus one additional bit has been loaded into the DFT unit. It is noted that even such a minute mismatch (less than 0.1%) introduces aberrations, which, as can be expected, become more significant for high frequencies. Finally, the figure shows how a DFT-compatible PRBS test signal provides a near-perfect baseline, which is white and smooth without need for additional corrections. None of these plots involve averaging. (a) and (b) would improve with averaging, (c) would not, and (d) does not require it. As mentioned earlier, the phase of a PRBS is considerably scattered. Unfortunately the slew rate of the present XY plotter is not sufficient to reproduce it here. FIGS. 7, 8, and 9 show actual calibrated plots of typical transfer functions.

FIG. 7 corresponds to a first-order system, measured over two overlapping ranges, covering four decades of frequency. The magnitude is a smooth curve from which accurate date can be extracted. The phase is also rather remarkable, considering that the data windows are 10 sec and 250 milliseconds, respectively, for the two ranges. The numerical values (−1.2°, 3.8°) are spot readings derived from the numeric display. Also shown is a partial plot of the phase at 10 times normal gain. This plot suggests that the computation noise is typically of the order of ± 0.5°.

FIG. 8 shows a similar plot for a second-order resonant network obtained on three overlapping bands. The small (5°) positive phase can be accurately evaluated and and the asymtotic phaser of −90° at high frequencies behaves as expected. Together, these three pairs of plots correspond to less than 12 seconds of data.

FIG. 9 shows the transfer function of 4th order Bessel and Butterworth filters which illustrates dynamic range of the system. This range (0 to about −50 or −60 dB) is essentially limited by DFT unit. Useful magnitude data can be extracted down to approx − 60dB. FIGS. 10 and 11 illustrate the function characteristics obtained from two notch filters that have been tested.

We also note that the system provides useful phase data down to about −55 dB beyond which the performance degrades rapidly. This is a rather impressive range for a method which yields a large number points at discrete frequencies, and which is implemented, here, with only 8 bits quantification in the DFT sampling.

Several salient features of the present approach have been suggested throughout the preceeding text. For the sake of completeness the following is a recapitulation and also a brief explahation of some important others:

1. Speed

No other known methods with the exception of the impulse response (or variations thereof) — can match the speed of the present measurements. Indeed, there is a basic relationship in signal analysis which is of the form $$\Delta t \Delta f \geq 1$$

which implies, for instance, that a one Hertz resolution requires at least one second of data. Strictly speaking, the present approach requires that the response be in steady-state. For all practical purposes, "steady-state" can usually be considered to have occurred once the input signal has been applied for a duration which is a few times (say 3) the inverse of the bandwidth $\Delta f$ of the narrowest spectral feature in the transfer function. This means that for well-behaved, physically-realizable transfer functions, the present method operates at near the theoretical maximum speed. Furthermore, unlike white noise analysis, basically it requires no averaging and, in practice might bring about something like a 100-fold speed improvement (i.e. measurements that might require minutes might be performed in seconds).

2. Accuracy — dynamic range

The present approach makes optimum use of the available dynamic range of the DFT operation (A-D quantification, length of computation register, resolution of sine/cosine ROM tables for DFT, etc) since the PRBS is the signal with the smallest peak-to-average power ratio which satisfy the white magnitude condition.

Furthermore, by virtue of feature 4, below, a system with large dynamic range of transfer function can be accomodated in a uniquely easy fashion with the present approach.

The intrinsic accuracy is essentially limited by quantization errors in the DFT (to which the present approach is relatively insensitive, as mentioned above). The phase of unknown system $Arg_H(k)$ is evaluated by taking the difference between successive measurements. In general, it is not recommended to measure small quantities by taking the difference between large ones, as we do here. However, this procedure, as implemented, does not contribute for a significant overall error because (i) the reference phase can be computed for a large white PRBS which fully exploits the dynamic range of the DFT memory and ii) the $tg^{-1}$ function and substraction are done digitally where high absolute accuracy and linearity (12bits) are readily possible. In fact, one might speculate that a scattered phase baseline may actually increase the usable accuracy since quantization errors in the DFT, digital division of B/A, $tg^{-1}$, substraction, etc, would not tend to be correlated over successive values of $k$, hence producing a more randomly distributed computation error than for a white phase signal.

3. Constant reference magnitude

Since the PRBS is automatically time-locked to the sampling, its actual power density (e.g. $V^2/HZ$) is automatically the inverse of the effective analysis resolution (HZ). (In other words, the r.m.s. value of the PRBS is independant of the clock rate). It follows that different frequency bands need not be recalibrated in magnitude and that measurements in overlapping bands product overlapping plots without correction factors for bandwidth (as is the case with impulse or white noise techniques which are not synchronised).

4. Conditioning filtering

Another unique advantage of the present approach relates to i. no need for pairs of matched antialiasing filters,
ii. the phase of conditioning filters is automatically cancelled.

Practical signals analysis always require some sort of conditioning filter in the signal path. For instance, the sampling theorem requires that the signal for DFT be band-limited to less than half the sampling frequency.

With regard to phase, all other methods (lissajous, cross-correlation, digital phase meter based on zero-crossings, etc). which involve computations based on the *simultaneous* combination of the reference and test signals require *a pair* of matched filters, one for the reference channel, one for the response channel (otherwise an unconvenient correction factor must be applied). Matching filters within a few degrees over a wide band is expensive or tedious, especially when they are of high-order (8, 10 etc.) as required for DFT.

In the present approach, the reference and the test are not combined physically, at the same time (but the synchronisation described here make it as if they were). Consequently, two distinct filters are *not* required. It is only needed that whatever the filter that has been selected it be used, sequentially, for the reference and for the test measurements: this single filter must simply have characteristics which are stable in time, a far less stringent requirement, which, in practice, bring considerable convenience and economy. This also allows an extension of the dynamic range of the instrument which would be fairly unpractical with other methods. For instance, say we wish to get phase information on the system of FIG. 9 in the 200–300 HZ region. The conditioning filter shown in the block diagram of FIG. 3 may then be adjusted for some (uncritical) band pass characteristics in that region. A new measurement (reference and test) with this filter in line will now allow to increase the magnitude of the response in the desired region and thus obtain adequate signal-to-noise ratio without overloading. Accurate phase data in that region will then be directly available, without corrections.

5. Reference needs only be processed once

With the synchronisation described here, the image of the PRBS is always the same in the DFT memory, since it is *independent* of the actual time base chosen. Hence, the basic reference computed for any analysis band is also valid for all the others and need not be repeated. This statement must be qualified. It is true only if the antialiasing filters have magnitude and phase characteristics which are invariant, for all the bands, in terms of normalized frequency. This may appear a difficult requirement but we have been able to demonstrate that in or prototype, at least, this was essentially the case. Data obtained by comparing the reference phases stored for different bands have shown a maximum deviation of 2°. The favorable consequence is that, indeed, the reference needs not be recomputed unless the starting state of the PRBS is purposely modified, or unless other conditioning filters are included in the signal path.

6. Two comments on the test signal — A DFT — compatible pseudo-random signal generator The present length of the PRBS, 1023 bits, was selected for convenience and because it provides an adequate baseline. With a sampling rate which is at twice the Nyquist minimum rate, the portion of the $|\sin x / x|$ magnitude function used is perfectly smooth and is flat with a maximum droop of 0, 91 dB for the last K component. This is acceptable for most applications. Loner sequences would further reduce this droop, and could easily be implemented.

The unique frequency and phase synchronization circuit used in the present instrument has been described above. Much of this circuit could be eliminated if the test signal was a core-image of the 1024 samples which are presently stored in the DFT memory during a reference measurement. Referring to FIG. 12 a test signal could be computed to high accuracy and then permanently stored on a ROM 32 controlled from clock 33 which would also provide a timing signal to sampling and memory circuit 11 (of FIG. 3) (say with 12 bits words). It would now be read-out at the *same* rate as the subsequent DFT sampling (one word for each sample) since the 1023-1024 interpolation would have been done once and for all (while it is presently redone for every sequence). While recording this pseudo-random signal (which is not binary any more) on the ROM, proper conditionning and antialiasing could be included. This could even be used to compensate for the minute magnitude droop mentioned above and provide perfectly white magnitude up to K. In addition to simplifying the synchronisation, this would relax the characteristics of the antialiasing filters used subsequently since, in a way, the ROM test signal would have been "preantialiased". Such filtering would also be automatically valid independent of the range selected.

In fact, in the form of a special purpose peripheral to a mini-computer, such a ROM-DFT compatible pseudo-random signal generator would be, basically, all that is required (in addition to a modest anti-aliasing filter designed to remove unavoidable extraneous noise).

We claim:

1. Apparatus for the measurement in real-time of the transfer function in both magnitude and phase of an unknown system comprising:
   a. means for engendering a pseudo-random binary sequence test signal, said signal spectrum being white in amplitude;
   b. a sampling and memory circuit;
   c. means to apply the test signal either directly to the sampling and memory circuit as a reference signal or to the unknown system such as to obtain a response signal that is applied to the sampling and memory circuit;
   d. means to match the timing of the said test signal and the sampling and memory circuit;
   e. means connected to the output of the sampling and memory circuit for measuring the discrete fourier transform in terms of magnitude and phase of the signal applied from the sampling and memory circuit;
   f. means for computing the magnitude portion of the transfer function from the signal obtained from the means for measuring discrete fourier transform, storing said magnitude portion of the transfer function and passing to an output;
   g. means for computing the phase portion of the transfer function from the signal obtained from the means for measuring discrete fourier transform;
   h. a first memory means connected to the output of the means for computing the phase portion of the transfer function for storing the phase portion of the transfer function in relation to the reference signal;
   i. a second memory means connected to the output of the means for computing the phase portion of the transfer function for storing the phase portion of the transfer function in relation to the response signal; and
   j. means for subtracting the signal obtained from the first and second memory means and passing the result to an output.

2. Apparatus for the measurement in real-time of the transfer function in both magnitude and phase of an unknown system as in claim 1 wherein the means for engendering the pseudo-random test signal is a Read-Only-Memory programmed to generate a signal white in magnitude and preantialiased.

3. Apparatus for the measurement in real-time of the transfer function in both magnitude and phase of an unknown system as in claim 1 wherein the means for engendering the pseudo-random binary sequence signal is a digital shift register with feedback to provide a predetermined form of pulse train signal connected to a master clock via a pulse dividing circuit, said clock being also connected to the sampling and memory means via a pulse dividing circuit to act as the timing matching means.

4. Apparatus for the measurement in real-time of the transfer function in both magnitude and phase of an unknown system as in claim 1 wherein the means for computing the phase portion of the transfer function includes a comparator for comparing the magnitude and signs of the two discrete fourier transform components to provide a phase data output in terms of sign and magnitude and a Read-Only-Memory in which is stored phase data in terms of angle and operative to convert the incoming discrete function transfer signals into angular terms.

* * * * *